(12) United States Patent
Fang et al.

(10) Patent No.: US 12,388,030 B2
(45) Date of Patent: Aug. 12, 2025

(54) SEMICONDUCTOR DEVICE WITH STRESS RELIEF FEATURE AND METHOD THEREFOR

(71) Applicant: NXP B.V., Eindhoven (NL)

(72) Inventors: Tzu Ya Fang, Tainan (TW); Yen-Chih Lin, Hsinchu (TW); Jian Nian Chen, Kosiiung (TW); Moly Lee, Kaohsiung (TW); Yi Xiu Xie, Minxiong (TW); Vanessa Wyn Jean Tan, Kuala Lumpur (MY); Yao Jung Chang, Kaohsiung (TW); Yi-Hsuan Tsai, Kaohsiung (TW); Xiu Hong Shen, Kaosiung (TW); Kuan Lin Huang, Changhua (TW)

(73) Assignee: NXP B.V., Eindhoven (NL)

( * ) Notice: Subject to any disclaimer, the term of this patent is extended or adjusted under 35 U.S.C. 154(b) by 537 days.

(21) Appl. No.: 17/815,638

(22) Filed: Jul. 28, 2022

(65) Prior Publication Data

US 2024/0038683 A1 Feb. 1, 2024

(51) Int. Cl.
*H01L 23/00* (2006.01)
*H01L 21/48* (2006.01)
(Continued)

(52) U.S. Cl.
CPC ........ *H01L 23/562* (2013.01); *H01L 21/4853* (2013.01); *H01L 21/4857* (2013.01);
(Continued)

(58) Field of Classification Search
CPC . H01L 23/562; H01L 23/3128; H01L 23/481; H01L 23/5383; H01L 23/5386; H01L 23/5389; H01L 23/49816; H01L 23/5385; H01L 23/3121; H01L 23/315; H01L 23/13; H01L 21/4853; H01L 21/4857; H01L 21/565; H01L 21/568; H01L 21/6835; H01L 24/81; H01L 24/19; H01L 24/20; H01L 25/0657; H01L 25/50; H01L 2221/68372; H01L 2224/214;
(Continued)

(56) References Cited

U.S. PATENT DOCUMENTS 8,102,058 B2   1/2012   Hsieh et al.
9,397,052 B2   7/2016   Oark et al.
(Continued)

OTHER PUBLICATIONS

Ma, M., "The Development and Technological Comparison of Various Die Stacking and Integration Options with TSV Si Interposer", 2016 IEEE 66th Electronic Components and Technology Conference, May 31-Jun. 3, 2016.

*Primary Examiner* — Marlon T Fletcher
*Assistant Examiner* — Christina A Sylvia

(57) ABSTRACT

A method of manufacturing a semiconductor device is provided. The method includes placing a package substrate on a carrier substrate, forming a frame on the package substrate, and affixing an active side of a semiconductor die on the package substrate. The semiconductor die together with the frame and the package substrate form a cavity between the semiconductor die and the package substrate. At least a portion of the semiconductor die and the package substrate are encapsulated with an encapsulant. The frame is configured to prevent the encapsulant from entering the cavity.

14 Claims, 12 Drawing Sheets

(51) Int. Cl.
  *H01L 21/56* (2006.01)
  *H01L 21/683* (2006.01)
  *H01L 23/31* (2006.01)
  *H01L 23/48* (2006.01)
  *H01L 23/538* (2006.01)
  *H01L 25/00* (2006.01)
  *H01L 25/065* (2023.01)

(52) U.S. Cl.
  CPC .......... *H01L 21/565* (2013.01); *H01L 21/568* (2013.01); *H01L 21/6835* (2013.01); *H01L 23/3128* (2013.01); *H01L 23/481* (2013.01); *H01L 23/5383* (2013.01); *H01L 23/5386* (2013.01); *H01L 23/5389* (2013.01); *H01L 24/19* (2013.01); *H01L 24/20* (2013.01); *H01L 25/0657* (2013.01); *H01L 25/50* (2013.01); *H01L 2221/68372* (2013.01); *H01L 2224/214* (2013.01); *H01L 2225/06513* (2013.01); *H01L 2225/06517* (2013.01); *H01L 2225/06541* (2013.01); *H01L 2225/06548* (2013.01); *H01L 2225/06586* (2013.01); *H01L 2924/17151* (2013.01); *H01L 2924/351* (2013.01)

(58) Field of Classification Search
  CPC . H01L 2225/06513; H01L 2225/06565; H01L 2225/06517; H01L 2225/06541; H01L 2225/06548; H01L 2225/06586; H01L 2924/17151; H01L 2924/351
  See application file for complete search history.

(56) References Cited

U.S. PATENT DOCUMENTS

| | | |
|---|---|---|
| 9,679,881 B2 | 6/2017 | Pagaila et al. |
| 9,735,113 B2 | 8/2017 | Chi et al. |
| 9,978,694 B2 | 5/2018 | Cho et al. |
| 2005/0001331 A1 | 1/2005 | Kojima et al. |
| 2010/0314730 A1 | 12/2010 | Labeeb |
| 2011/0186973 A1 | 8/2011 | Pagaila et al. |
| 2015/0235936 A1* | 8/2015 | Yu ............... H01L 23/36 257/737 |
| 2019/0279925 A1* | 9/2019 | Hsu ............... H01L 24/17 |
| 2020/0066621 A1* | 2/2020 | Liu ............... H01L 23/5386 |
| 2020/0365573 A1* | 11/2020 | Zluc ............... H10F 71/00 |

* cited by examiner

SEMICONDUCTOR DEVICE WITH STRESS RELIEF FEATURE AND METHOD THEREFOR

BACKGROUND

Field

This disclosure relates generally to semiconductor device packaging, and more specifically, to semiconductor devices with a stress relief feature and method of forming the same.

Related Art

Today, there is an increasing trend to include sophisticated semiconductor devices in products and systems that are used every day. These sophisticated semiconductor devices may include features for specific applications which may impact the configuration of the semiconductor device packages, for example. For some features and applications, the configuration of the semiconductor device packages may be susceptible to lower reliability, lower performance, and higher product or system costs. Accordingly, significant challenges exist in accommodating these features and applications while minimizing the impact on semiconductor devices' reliability, performance, and costs.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Generally, there is provided, a semiconductor device with a stress relief feature. The stress relief feature of the semiconductor device includes a cavity frame formed on a package substrate. A semiconductor die is affixed over the frame and attached to the package substrate to form a cavity between the semiconductor die and the package substrate. The frame acts a barrier to prevent mold compound from entering the cavity during an encapsulation operation. Because the cavity remains void of encapsulant material, the cavity serves as a stress relief feature. The cavity is located adjacent to an active region of the semiconductor die such that a stress sensitive circuit or sensor of the active region is substantially surrounded by the cavity frame. By forming the stress relief feature in this manner, stress sensitive circuits or sensors are not affected by the physical stresses of the encapsulant.

Figure 1:
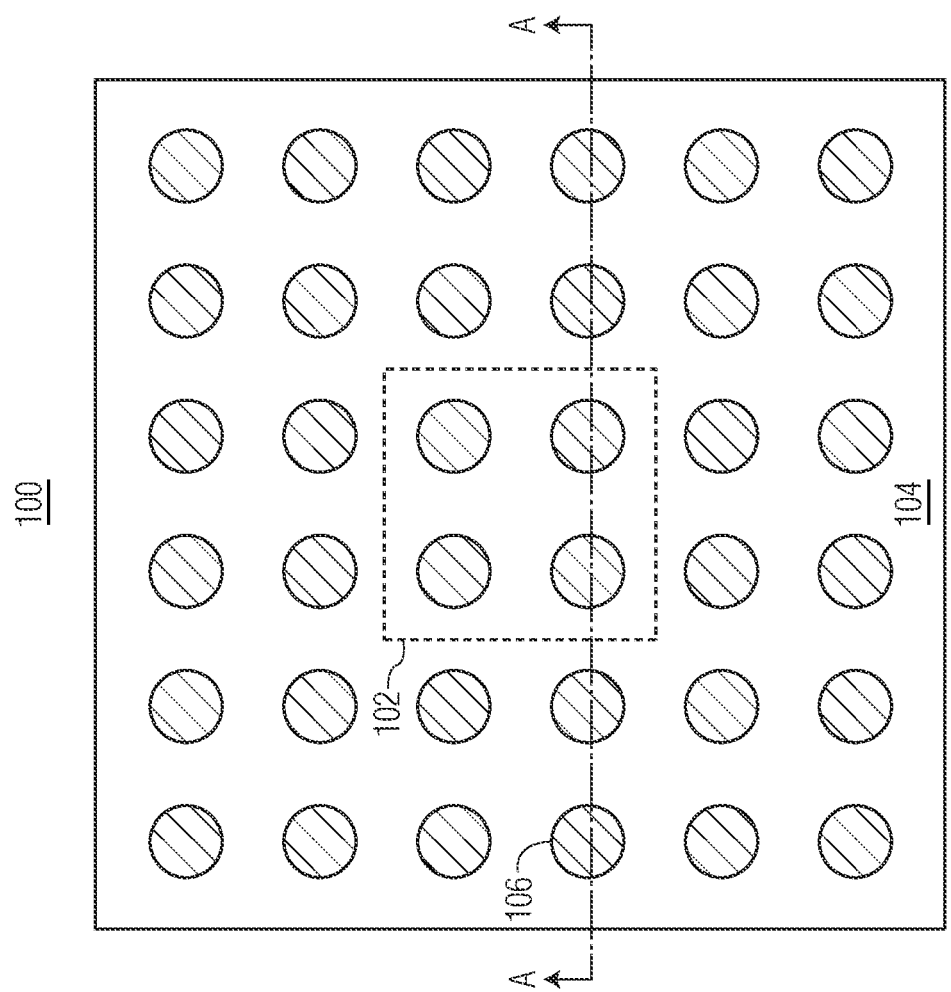
FIG. 1 illustrates, in a simplified bottom-side-up plan view, an example semiconductor device having a stress relief feature at a stage of manufacture in accordance with an embodiment.

FIG. 1 illustrates, in a simplified bottom-side-up plan view, an example semiconductor device 100 having a stress relief feature at a stage of manufacture in accordance with an embodiment. In this embodiment, a bottom side of interconnecting package substrate 104 applied on the semiconductor device 100 is depicted. A plurality of conductive connectors 106 (e.g., solder balls) are affixed to the bottom side of the package substrate 104. An underlying semiconductor die 102 (shown as dashed outline for reference) are embedded in an encapsulant (not shown) of the semiconductor device 100. The number and arrangement of the conductive connectors 106 in this embodiment are chosen for illustration purposes. The term "conductive," as used herein, generally refers to electrical conductivity unless otherwise specified. Simplified cross-sectional views of the example semiconductor device 100 taken along line A-A at stages of manufacture are depicted in FIG. 2 through FIG. 12.

Figure 2:
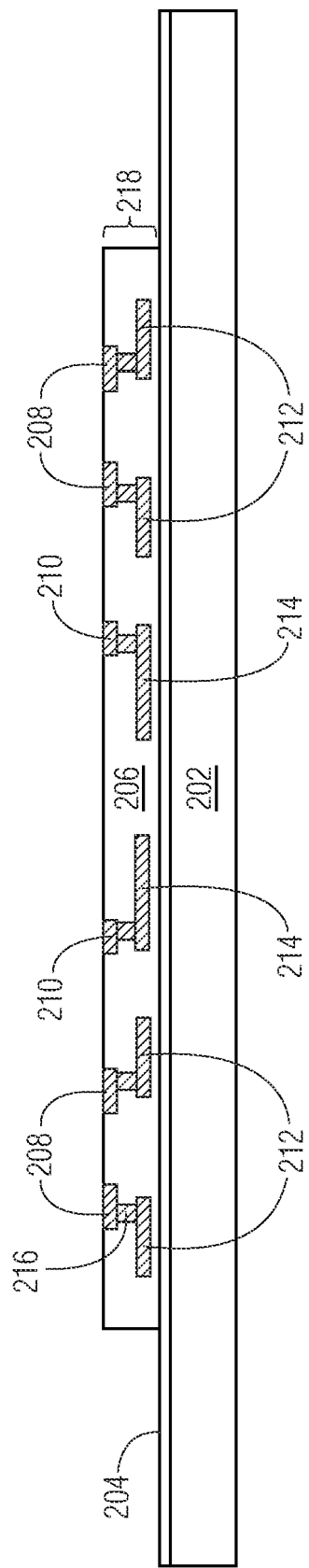
FIG. 2 through FIG. 12 illustrate, in simplified cross-sectional views, the example semiconductor device at stages of manufacture in accordance with an embodiment.

FIG. 2 illustrates, in a simplified cross-sectional view, the example semiconductor device 100 taken along line A-A at a stage of manufacture in accordance with an embodiment. At this stage, the semiconductor device 100 includes a first package substrate 218 placed on a carrier substrate 202. The carrier substrate 202 includes a releasable adhesive 204 applied on a top surface. The carrier substrate 202 is configured and arranged to provide a temporary structure for placement of the package substrate 218 and subsequent steps at stages of manufacture, for example. In this embodiment, the package substrate 218 corresponds to the package substrate 104 shown in FIG. 1.

The package substrate 218 includes conductive features (e.g., traces 208-216) surrounded by non-conductive material 206 (e.g., dielectric). In this embodiment, the conductive traces 208-216 are formed from patterned metal (e.g., copper) layers separated by dielectric layers of the package substrate 218. The traces 208-216 are formed in the package substrate to interconnect a semiconductor die with a printed circuit board (PCB), for example. In this embodiment, portions of the traces 208 and 210 are exposed at the top side of the package substrate 218 and configured to serve as conductive connection pads for connection of a semiconductor die and through package vias (TPVs) at subsequent stages of manufacture. Portions of the traces 212 and 214 are configured to serve as conductive substrate pads at the bottom side of the package substrate 218 for attachment of conductive connectors at a subsequent stage of manufacture. The package substrate 218 may be characterized as a redistribution layer substrate and may be provided as a preformed package substrate placed on the carrier substrate 202 or may be formed as a build-up package substrate directly on the carrier substrate 202.

Figure 3:
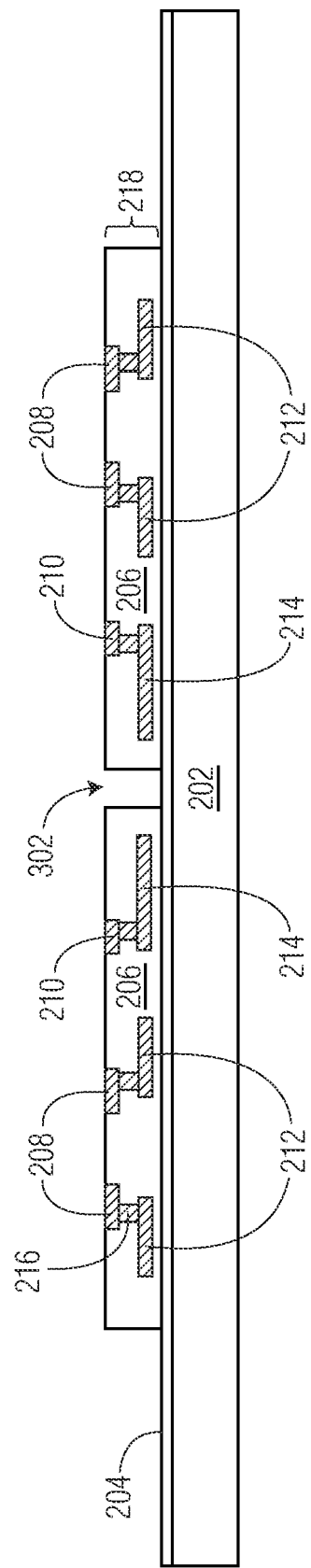

FIG. 3 illustrates, in a simplified cross-sectional view, the example semiconductor device 100 taken along line A-A at a subsequent stage of manufacture in accordance with an embodiment. At this stage, an opening 302 is formed through the package substrate 218. The opening 302 may be formed before the package substrate 218 is placed on the carrier substrate 202. In this embodiment, the opening 302 through the package substrate 218 may be configured as a passageway to allow pressure equalization with an embedded cavity formed at a subsequent stage of manufacture.

Figure 4:
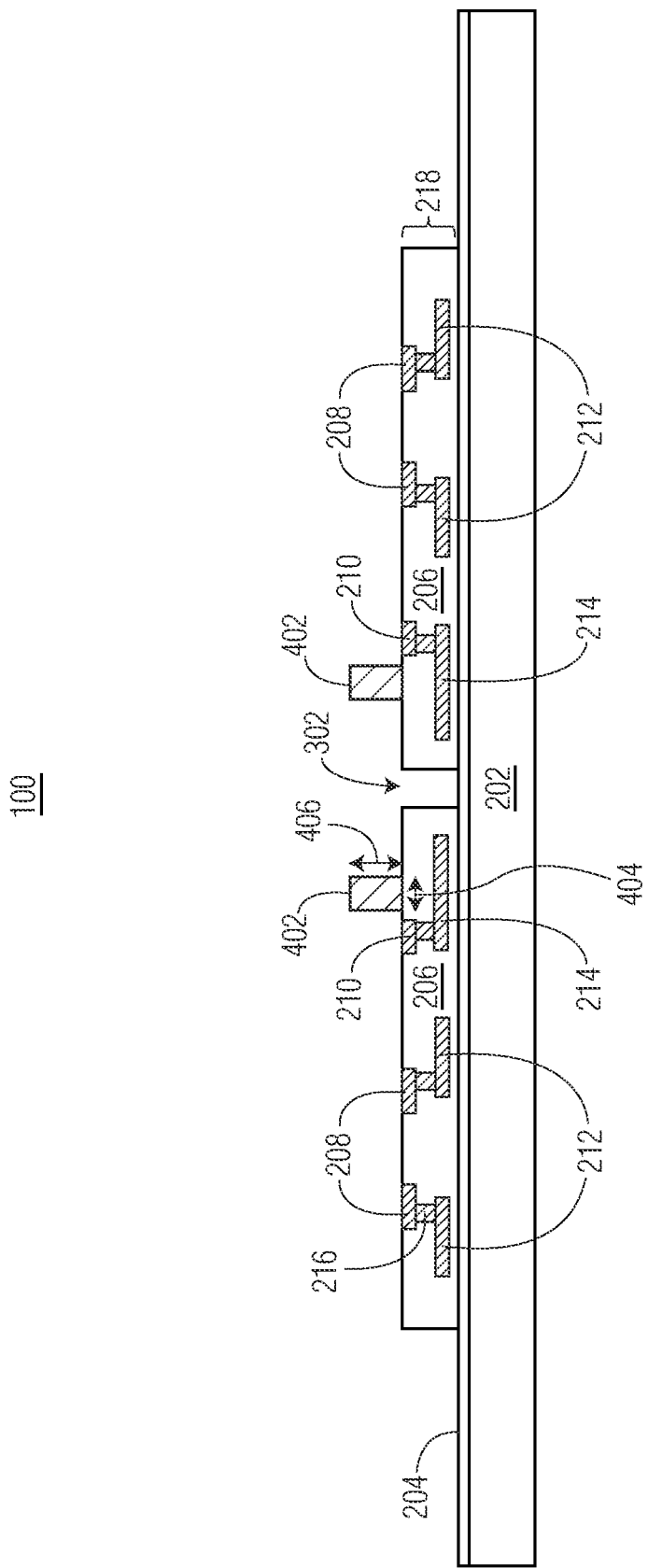

FIG. 4 illustrates, in a simplified cross-sectional view, the example semiconductor device 100 taken along line A-A at a subsequent stage of manufacture in accordance with an embodiment. At this stage, a cavity frame 402 is placed, dispensed, or otherwise formed on the package substrate 218. The frame 402 is configured to form a cavity at a predetermined location when a semiconductor die is affixed over the frame at a subsequent stage of manufacture, for example. In this embodiment, the frame 402 is formed as an enclosed ring having a predetermined wall width dimension 404 (e.g., ~10 microns or less) and wall height dimension 406 (e.g., ~10-50 microns). The wall dimensions 404 and 406 may be chosen to sufficiently prevent mold compound from breaching the frame 402 during an encapsulation operation at a subsequent stage, for example. The frame 402 may be formed having any suitable shape such as orthogonal shapes (e.g., square, rectangular), circular, oval, and combinations thereof. The frame 402 may be formed from suitable materials such as gel coat, epoxy, silicone, and the like to prevent mold compound from entering a cavity formed in part by the frame 402.

Figure 5:
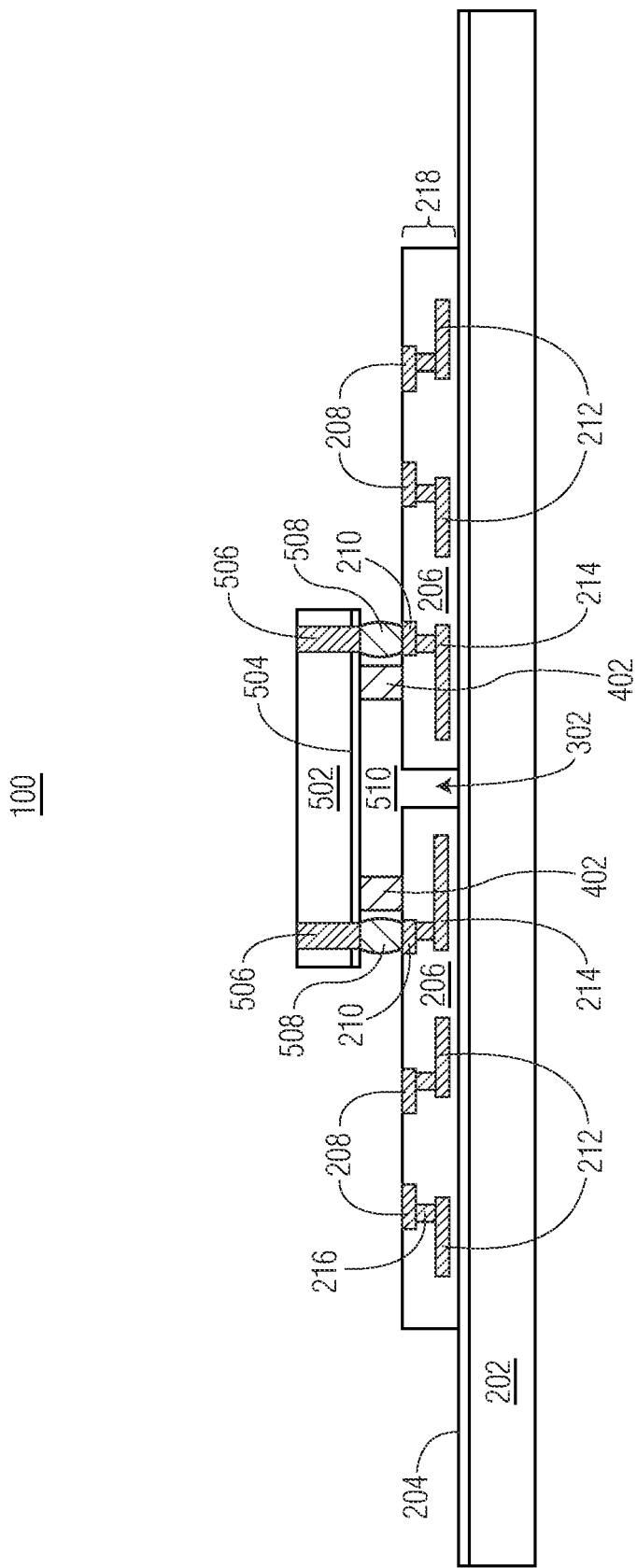

FIG. 5 illustrates, in a simplified cross-sectional view, the example semiconductor device 100 taken along line A-A at a subsequent stage of manufacture in accordance with an embodiment. At this stage, a first semiconductor die 502 is affixed to the package substrate 218. In this embodiment, the semiconductor die 502 corresponds to the underlying semiconductor die 102 depicted in FIG. 1. The semiconductor die 502 is positioned over the frame 402 and in direct contact with the frame when affixed to the package substrate 218 by way of conductive die connectors 508. With the semiconductor die 502 attached to the package substrate 218 and in contact with the frame 402, a cavity 510 is formed. The opening 302 through the package substrate 218 may be configured as a passageway to allow pressure equalization between the cavity 510 and the atmosphere immediately surrounding the semiconductor device 100, for example.

The semiconductor die 502 has an active side (e.g., major side having circuitry) and a backside (e.g., major side opposite of the active side). The semiconductor die 502 includes an active region 504 (e.g., circuitry, bond pads, etc.) formed at the active side. Bond pads (not shown) of the active region 504 may be configured for connection to respective exposed portions of the traces 210 serving as conductive connection pads by way of conductive die connectors 508, for example. In this embodiment, semiconductor die 502 is configured in an active-side-down orientation with the active side affixed to the package substrate 218. The cavity 510 is formed between the active side of the semiconductor die 502 and the package substrate 218 with the walls of the frame 402 substantially surrounding at least a portion of the active region 504. The portion of the active region 504 adjacent to the cavity 510 may include features such as circuitry and/or sensors which are characterized as stress sensitive features.

The semiconductor die 502 may be formed from any suitable semiconductor material, such as silicon, germanium, gallium arsenide, gallium nitride, and the like. The semiconductor die 502 may further include digital circuitry, analog circuitry, RF circuitry, a memory, a processor, a sensor, the like, and combinations thereof at the active side.

In this embodiment, the conductive die connectors 508 have a first end affixed to the active region 504 of the semiconductor die 502 and a second end affixed to respective exposed portions of the traces 210 to form electrically conductive interconnects between the semiconductor die 502 and the package substrate 218. The conductive die connectors 508 may be in the form of any suitable conductive structures such as gold studs, copper pillars, solder balls, and the like. In some embodiments, the semiconductor die 502 may further include one or more conductive through silicon vias (TSVs) 506. Accordingly, one or more of the TSVs 506 may be interconnected with conductive traces (e.g., trace 210) of the package substrate 218 by way of conductive die connectors 508. The location and number of the TSVs 506 are chosen for illustration purposes.

Figure 6:
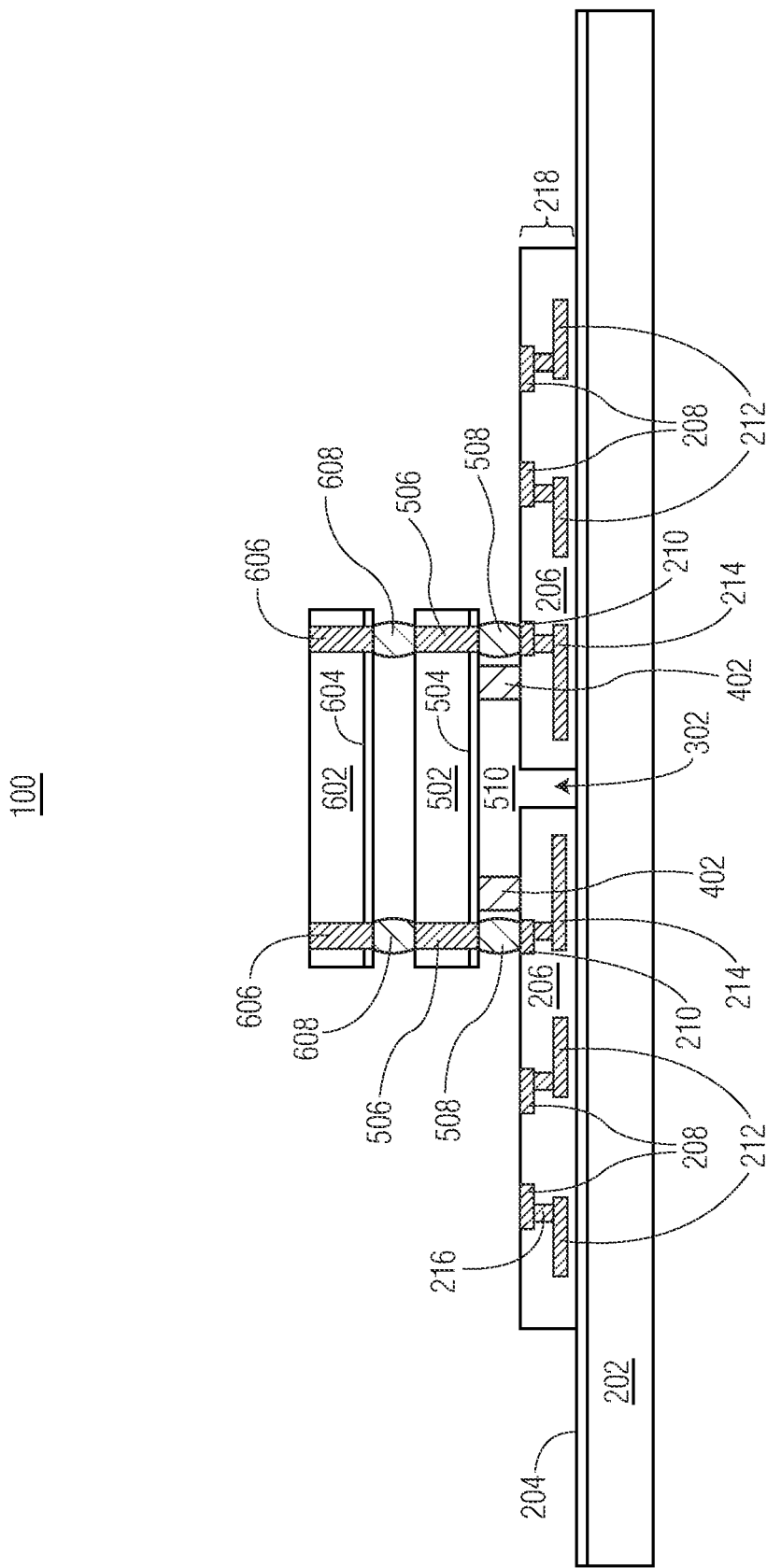

FIG. 6 illustrates, in a simplified cross-sectional view, the example semiconductor device 100 taken along line A-A at a subsequent stage of manufacture in accordance with an embodiment. At this stage, a second semiconductor die 602 is affixed to the first semiconductor die 502 in a stacked die configuration. The semiconductor die 602 is affixed to the semiconductor die 502 by way of conductive die connectors 608.

The semiconductor die 602 has an active side (e.g., major side having circuitry) and a backside (e.g., major side opposite of the active side). The semiconductor die 602 includes an active region 604 (e.g., circuitry, bond pads, etc.) formed at the active side. Bond pads (not shown) of the active region 604 may be configured for connection to respective TSVs 506 of the semiconductor die 502 by way of conductive die connectors 608, for example. In this embodiment, semiconductor die 602 is configured in an active-side-down orientation with the active side affixed to the backside (e.g., TSVs 506) of the semiconductor die 502. The semiconductor die 602 may be formed from any suitable semiconductor material, such as silicon, germanium, gallium arsenide, gallium nitride, and the like. The semiconductor die 602 may further include digital circuitry, analog circuitry, RF circuitry, a memory, a processor, a sensor, the like, and combinations thereof at the active side.

In this embodiment, the conductive die connectors 608 have a first end affixed to the active region 604 of the semiconductor die 602 and a second end affixed to respective TSVs 506 to form electrically conductive interconnects between the semiconductor die 602 and the semiconductor die 502 and the package substrate 218. The conductive die connectors 608 may be in the form of any suitable conductive structures such as gold studs, copper pillars, solder balls, and the like. In some embodiments, the semiconductor die 602 may further include one or more through silicon vias (TSVs) 606. For example, one or more of the TSVs 606 may be interconnected with the semiconductor die 502 by way of conductive die connectors 608 and TSVs 506 and may be further interconnected to the conductive traces (e.g., trace 210) of the package substrate 218 by way of conductive die connectors 508. The location and number of the TSVs 606 are chosen for illustration purposes.

Figure 7:
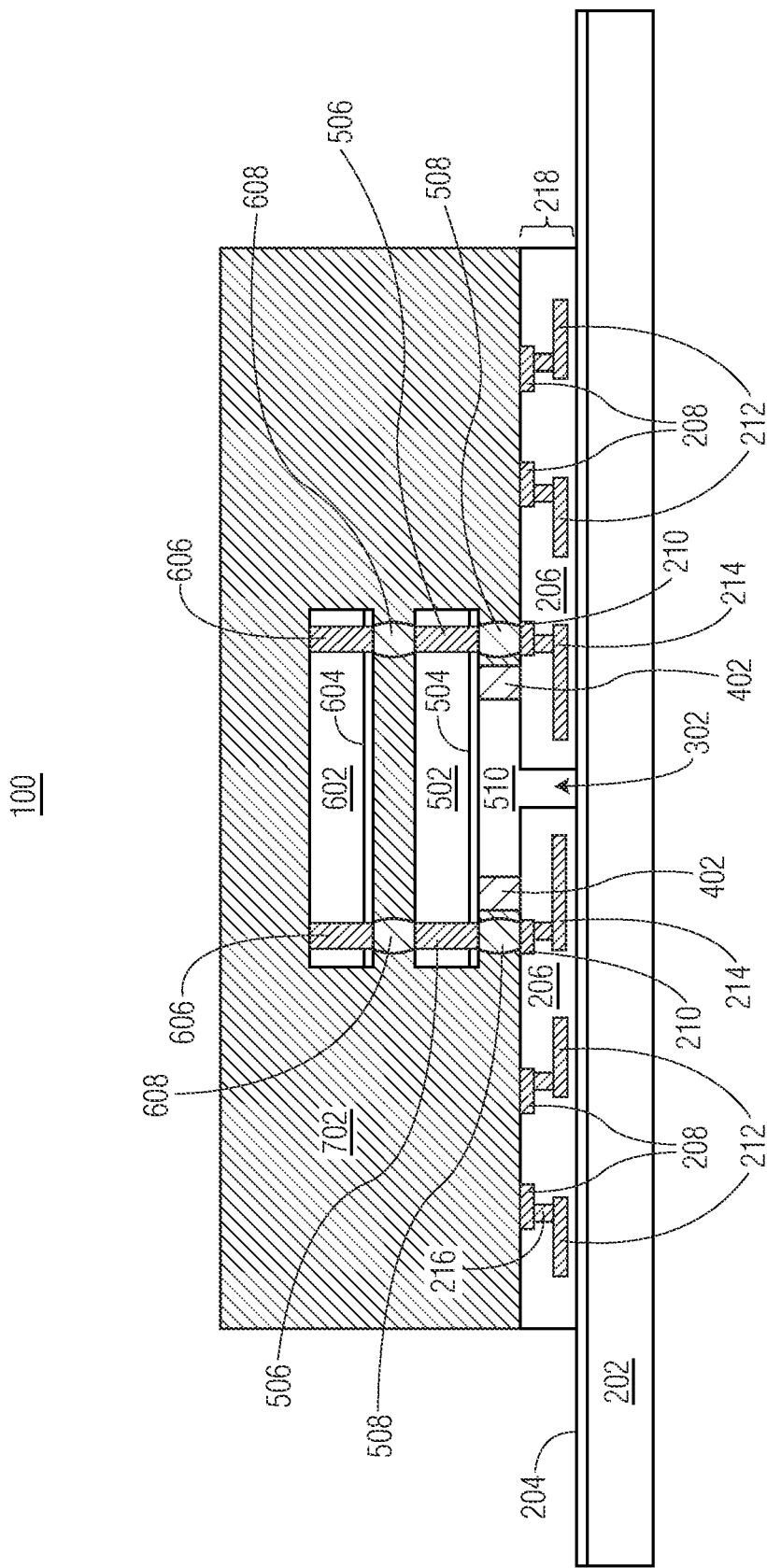

FIG. 7 illustrates, in a simplified cross-sectional view, the example semiconductor device 100 taken along line A-A at a subsequent stage of manufacture in accordance with an embodiment. At this stage, the semiconductor device 100 includes the stacked die (e.g., semiconductor die 502 and 602) and the package substrate 218 at least partially encapsulated with an encapsulant 702 (e.g., epoxy molding compound) while temporarily affixed on the carrier substrate 202. In this embodiment, the semiconductor die 502 and 602 and the package substrate 218 are over-molded with the encapsulant 702 by way of a molding process. The frame 402 serves as a barrier prohibiting the encapsulant 702 from entering the cavity 510. Because the cavity 510 is void of encapsulant material, the encapsulant 702 is prevented from interacting with the portion of the active region 504 adjacent to the cavity 510. Accordingly, the portion of the active region 504 adjacent to the cavity 510 may include stress sensitive features without being affected by physical stresses of the encapsulant.

Figure 8:
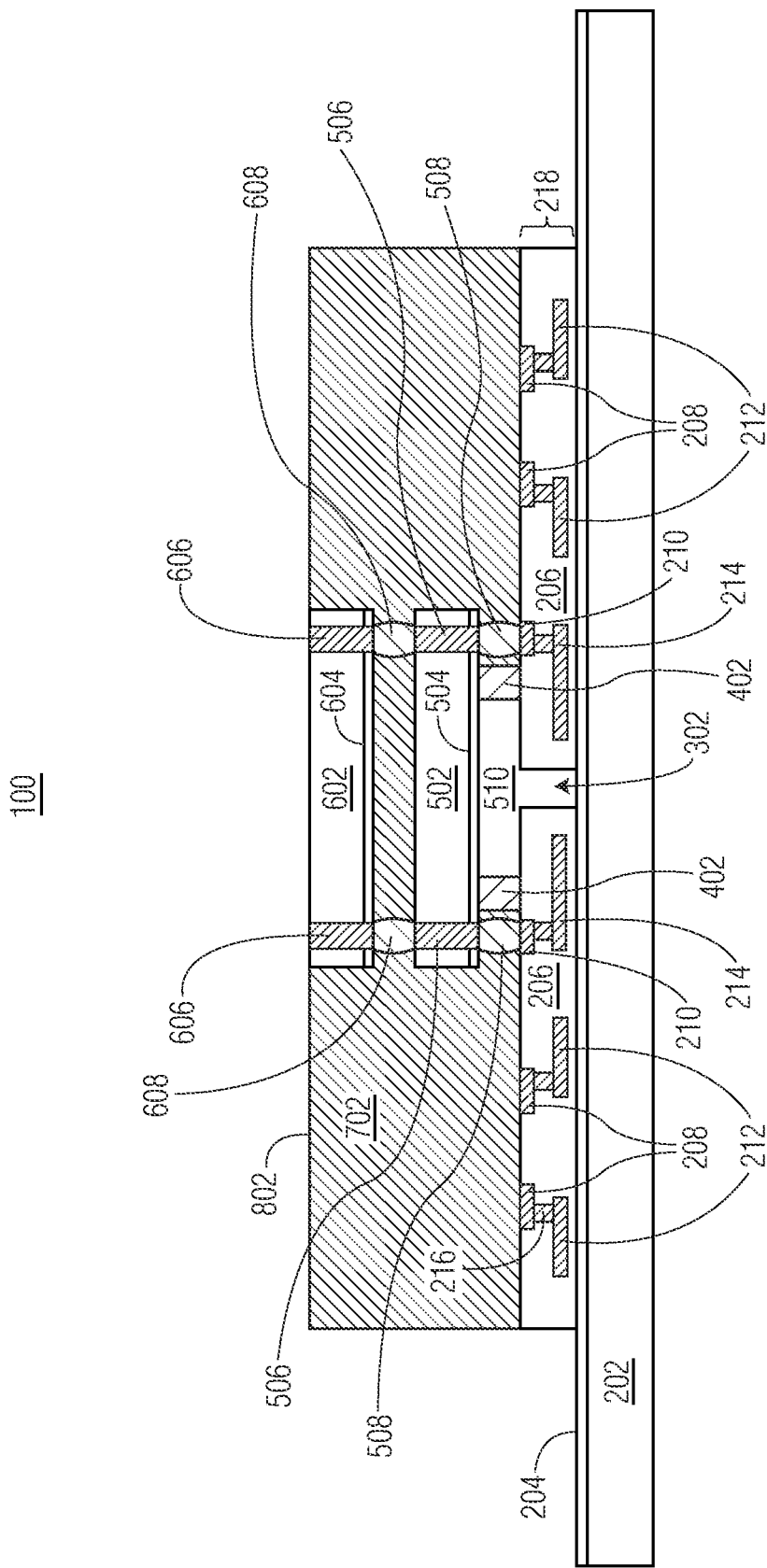

FIG. 8 illustrates, in a simplified cross-sectional view, the example semiconductor device 100 taken along line A-A at a subsequent stage of manufacture in accordance with an embodiment. At this stage, the backside of the semiconductor die 602 and portions of the TSVs 606 are revealed at the surface 802 of the encapsulant 702. In this embodiment, the encapsulated semiconductor device 100 is subjected to a grind operation to expose the backside of the semiconductor die 602 and portions of the TSVs 606. Alternatively, the semiconductor die 502 and 602 and the package substrate 218 may be molded with the encapsulant 702 by way of a film-assisted molding (FAM) process. For example, a FAM tool may be engaged with the backside of the semiconductor die 602 during the FAM molding process to keep the backside of the semiconductor die 602 and portions of the TSVs 606 free from encapsulant. In this manner, the backside of the semiconductor die 602 and portions of the TSVs 606 may be exposed at the surface 802 of the encapsulant 702 without a grind operation.

Figure 9:
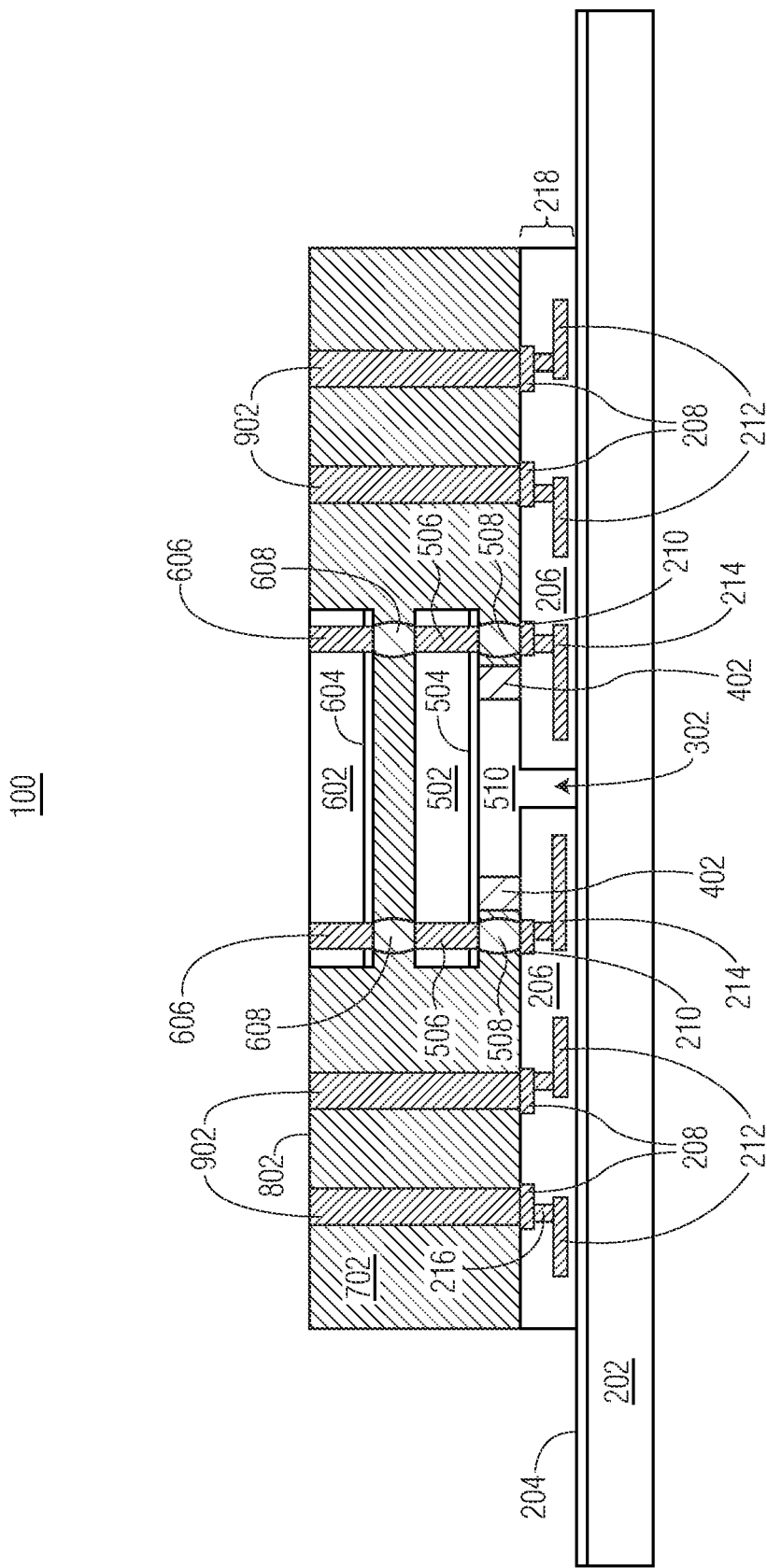

FIG. 9 illustrates, in a simplified cross-sectional view, the example semiconductor device 100 taken along line A-A at a subsequent stage of manufacture in accordance with an embodiment. At this stage, one or more conductive through package vias (TPVs) 902 may be formed through the encapsulant 702. In this embodiment, the one or more of the TPVs 902 have a first end exposed at the surface 802 of the encapsulant 702 and a second end electrically connected to conductive traces (e.g., trace 208) of the package substrate 218. The location and number of the TPVs 902 are chosen for illustration purposes.

Figure 10:
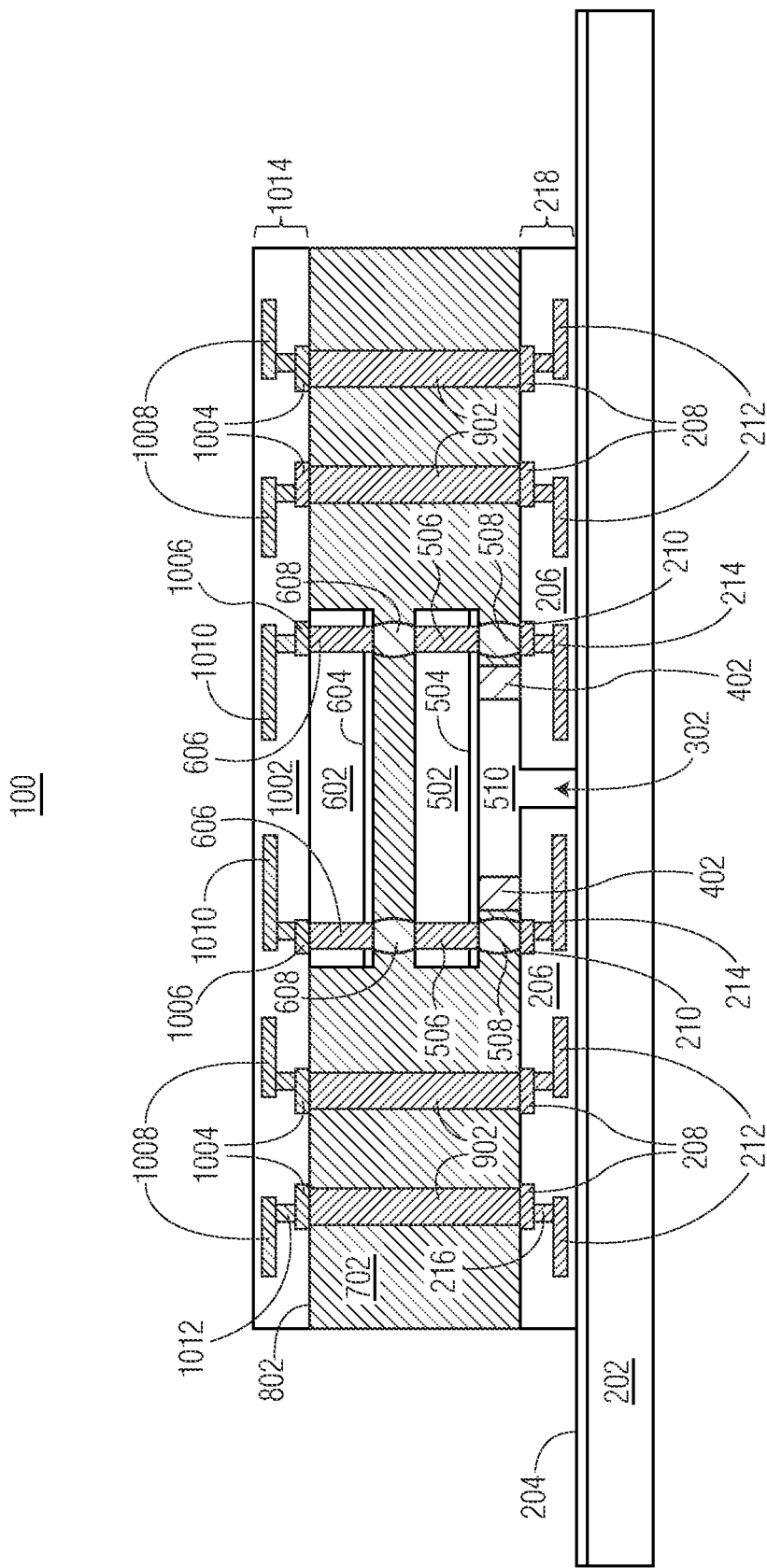

FIG. 10 illustrates, in a simplified cross-sectional view, the example semiconductor device 100 taken along line A-A at a subsequent stage of manufacture in accordance with an embodiment. At this stage, the semiconductor device 100 includes a second package substrate 1014 applied on the backside of the semiconductor die 602 and the surface 802 of the encapsulant 702. The package substrate 1014 may be characterized as a redistribution layer substrate and may be provided as a pre-formed package substrate affixed on the backside of the semiconductor die 602 and the surface 802 of the encapsulant 702 or may be formed as a build-up package substrate directly on the on the backside of the semiconductor die 602 and the surface 802.

The package substrate 1014 includes conductive features (e.g., traces 1004-1012) surrounded by non-conductive material 1002 (e.g., dielectric). In this embodiment, the conductive traces 1004-1012 are formed from patterned metal (e.g., copper) layers separated by dielectric layers of the package substrate 1014. The traces 1004-1012 are formed in the package substrate 1014 to interconnect the semiconductor device 100 with a PCB or external device, for example. In this embodiment, portions of the traces 1006 are conductively connected to the TSVs 606 exposed at the backside of the semiconductor die 602 and portions of the traces 1004 are conductively connected to the TPVs 902 exposed at the surface 802 of the encapsulant 702. Portions of the traces 1008 and 1010 are configured to serve as conductive substrate pads for attachment of conductive connectors at a subsequent stage of manufacture.

Figure 11:
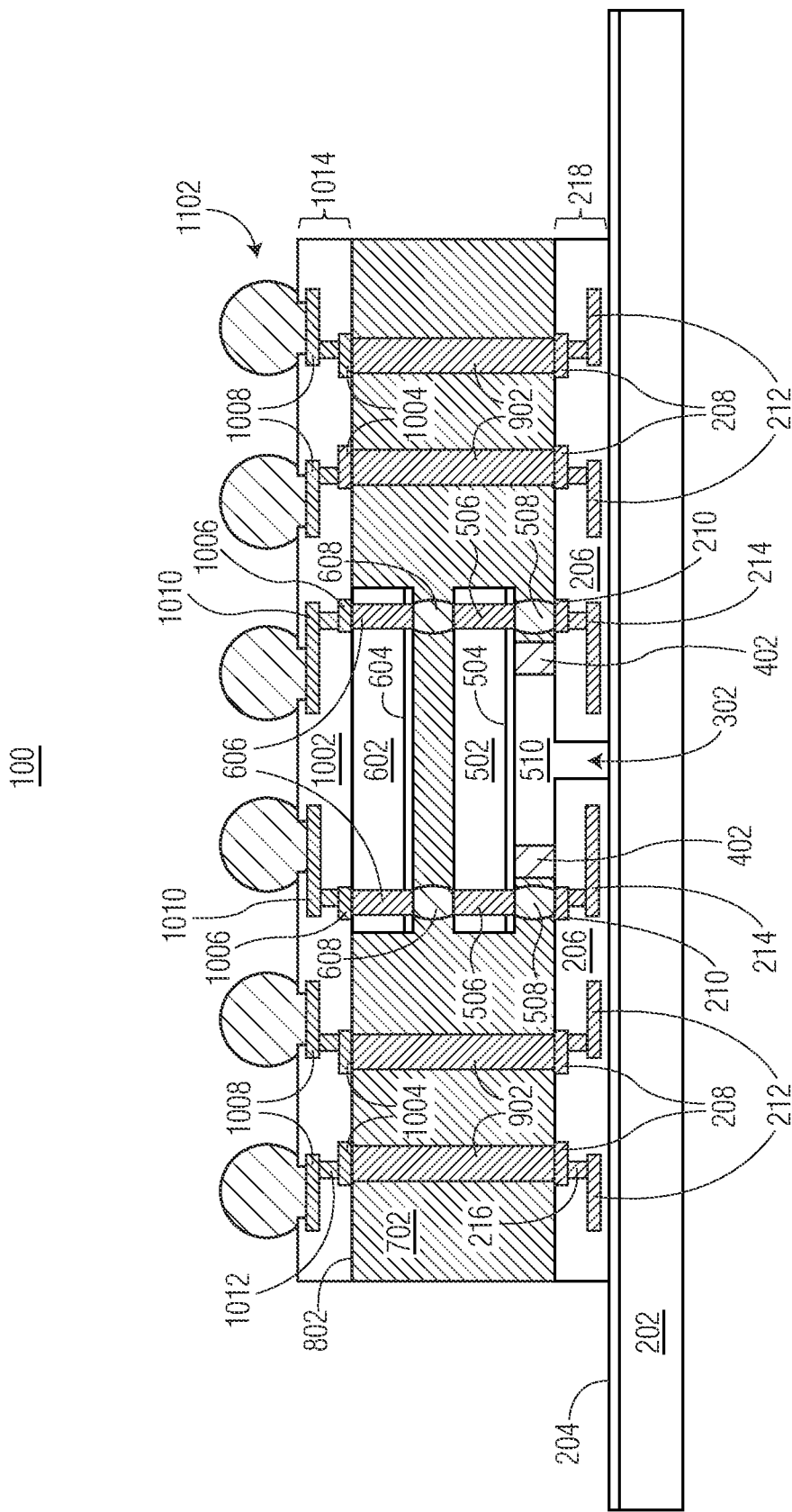

FIG. 11 illustrates, in a simplified cross-sectional view, the example semiconductor device 100 taken along line A-A at a subsequent stage of manufacture in accordance with an embodiment. At this stage, the semiconductor device 100 includes a plurality of conductive connectors 1102 (e.g., solder balls) affixed to the package substrate 1014. In this embodiment, openings are formed in the non-conductive material 1002 to expose portions of the conductive traces 1008 and 1010 and the conductive connectors 1102 are attached to the exposed portions of the traces 1008 and 1010. The conductive connectors 1102 are configured and arranged to provide conductive connections between the semiconductor device 100 and a PCB or external device, for example. The conductive connectors 1102 may be in the form of any suitable conductive structures such as solder balls, gold studs, copper pillars, and the like, to connect conductive features of the semiconductor device 100 with the PCB or external device. As an alternative to attaching conductive connectors 1102, the exposed portions of the traces 1008 and 1010 may be plated for subsequent connection with the PCB or external device by way of solder paste attachment or other suitable conductive attachment processes (e.g., ACF, ACP).

Figure 12:
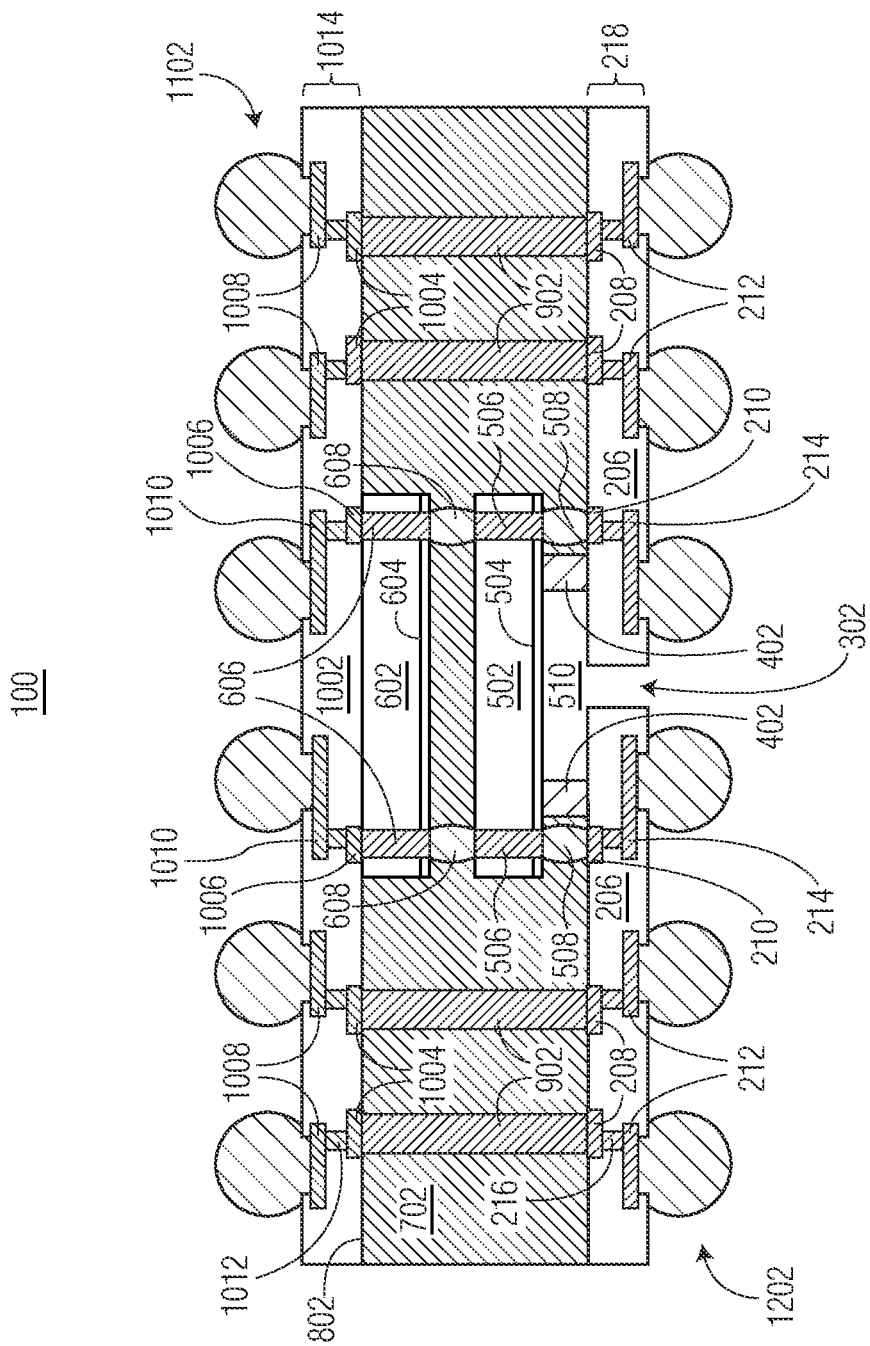

FIG. 12 illustrates, in a simplified cross-sectional view, the example semiconductor device 100 taken along line A-A at a subsequent stage of manufacture in accordance with an embodiment. At this stage, the semiconductor device 100 is separated from the carrier substrate 202 and a plurality of conductive connectors 1202 (e.g., solder balls) are affixed to the package substrate 218. In this embodiment, openings are formed in the non-conductive material 206 to expose portions of the conductive traces 212 and 214 and the conductive connectors 1202 are attached to the exposed portions of the traces 212 and 214. The conductive connectors 1202 are configured and arranged to provide conductive connections between the semiconductor device 100 and a PCB or external device, for example. The conductive connectors 1202 may be in the form of any suitable conductive structures such as solder balls, gold studs, copper pillars, and the like, to connect conductive features of the semiconductor device 100 with the PCB or external device. As an alternative to attaching conductive connectors 1202, the exposed portions of the traces 212 and 214 may be plated for subsequent connection with the PCB or external device by way of solder paste attachment or other suitable conductive attachment processes (e.g., ACF, ACP).

Generally, there is provided, a method of manufacturing a semiconductor device including placing a first package substrate on a carrier substrate; forming a frame on the first package substrate; affixing an active side of a first semiconductor die on the package substrate, the first semiconductor die together with the frame and the first package substrate forming a cavity between the first semiconductor die and the first package substrate; and encapsulating with an encapsulant at least a portion of the first semiconductor die and the first package substrate, the frame preventing the encapsulant from entering the cavity. The active side of the first semiconductor die may be interconnected to a conductive trace of the first package substrate by way of a conductive die connector. The frame may be configured to substantially surround a portion of the active side of the first semiconductor die, the portion of the active side including circuitry characterized as stress sensitive circuitry. The package substrate may include an opening through the first package substrate, the opening configured to allow pressure equalization between the cavity and atmosphere immediately surrounding the semiconductor device. The first semiconductor die may include a through silicon via (TSV), the TSV forming an electrically conductive interconnect between the active side and a backside of the first semiconductor die. The method may further include affixing an active side of a second semiconductor die on the backside of the first semiconductor die before encapsulating with an encapsulant, the second semiconductor die electrically interconnected with the first semiconductor die by way of the TSV. The method may further include forming a through package via (TPV), the TPV forming an electrically conductive interconnect between a first major side of the encapsulant adjacent to the first package substrate and a second major side of the encapsulant. The method may further include applying a second package substrate on the second major side of the encapsulant. The method may further include interconnecting a conductive trace of the second package substrate with a conductive trace of the first package substrate by way of the TPV.

In another embodiment, there is provided, a semiconductor device including a frame formed on a first package substrate; an active side of a first semiconductor die affixed on the first package substrate, the first semiconductor die together with the frame and the first package substrate forming a cavity between the first semiconductor die and the first package substrate; and an encapsulant encapsulating at least a portion of the first semiconductor die and the first package substrate, the cavity void of the encapsulant. The active side of the first semiconductor die may be interconnected to a conductive trace of the first package substrate by way of a conductive die connector. The frame may substantially surround a portion of the active side of the first semiconductor die, the portion of the active side including circuitry characterized as stress sensitive circuitry. The package substrate may include an opening through the first package substrate, the opening configured to allow pressure equalization between the cavity and atmosphere immediately surrounding the semiconductor device. The first semiconductor die may include a through silicon via (TSV), the TSV forming an electrically conductive interconnect between the active side and a backside of the first semiconductor die. The device may further include affixing an active side of a second semiconductor die on the backside of the first semiconductor die, the second semiconductor die electrically interconnected with the first semiconductor die by way of the TSV.

In yet another embodiment, there is provided, a method including placing a first package substrate on a carrier substrate; forming a frame on the first package substrate; affixing an active side of a first semiconductor die on the package substrate, the first semiconductor die located over the frame forming a cavity between the first semiconductor die and the first package substrate; and encapsulating with an encapsulant at least a portion of the first semiconductor die and the first package substrate, the frame preventing the encapsulant from entering the cavity. The active side of the first semiconductor die may be interconnected to a conductive trace of the first package substrate by way of a conductive die connector. The frame may be configured to substantially surround a portion of the active side of the first semiconductor die, the portion of the active side including circuitry characterized as stress sensitive circuitry. The package substrate may include an opening through the first package substrate, the opening configured to allow pressure equalization between the cavity and atmosphere immediately surrounding the semiconductor device. The method may further include applying a second package substrate over a major side of the encapsulant opposite of the first package substrate, the second package substrate interconnected with the first package substrate by way of a through package via (TPV).

By now, it should be appreciated that there has been provided a semiconductor device with a stress relief feature. The stress relief feature of the semiconductor device includes a cavity frame formed on a package substrate. A semiconductor die is affixed over the frame and attached to the package substrate to form a cavity between the semiconductor die and the package substrate. The frame acts a barrier to prevent mold compound from entering the cavity during an encapsulation operation. Because the cavity remains void of encapsulant material, the cavity serves as a stress relief feature. The cavity is located adjacent to an active region of the semiconductor die such that a stress sensitive circuit or sensor of the active region is substantially surrounded by the cavity frame. By forming the stress relief feature in this manner, stress sensitive circuits or sensors are not affected by the physical stresses of the encapsulant.

The terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method of manufacturing a semiconductor device, the method comprising:
    placing a first package substrate on a carrier substrate;
    forming a frame on the first package substrate;
    affixing an active side of a first semiconductor die on the package substrate, the first semiconductor die together with the frame and the first package substrate forming a cavity between the first semiconductor die and the first package substrate; and
    encapsulating with an encapsulant at least a portion of the first semiconductor die and the first package substrate, the frame preventing the encapsulant from entering the cavity.

2. The method of claim 1, wherein the active side of the first semiconductor die is interconnected to a conductive trace of the first package substrate by way of a conductive die connector.

3. The method of claim 1, wherein the frame is configured to substantially surround a portion of the active side of the first semiconductor die, the portion of the active side including circuitry characterized as stress sensitive circuitry.

4. The method of claim 1, wherein the package substrate includes an opening through the first package substrate, the opening configured to allow pressure equalization between the cavity and atmosphere immediately surrounding the semiconductor device.

5. The method of claim 1, wherein the first semiconductor die includes a through silicon via (TSV), the TSV forming an electrically conductive interconnect between the active side and a backside of the first semiconductor die.

6. The method of claim 5, further comprising affixing an active side of a second semiconductor die on the backside of the first semiconductor die before encapsulating with an encapsulant, the second semiconductor die electrically interconnected with the first semiconductor die by way of the TSV.

7. The method of claim 1, further comprising forming a through package via (TPV), the TPV forming an electrically conductive interconnect between a first major side of the encapsulant adjacent to the first package substrate and a second major side of the encapsulant.

8. The method of claim 7, further comprising applying a second package substrate on the second major side of the encapsulant.

9. The method of claim 8, further comprising interconnecting a conductive trace of the second package substrate with a conductive trace of the first package substrate by way of the TPV.

10. A method comprising:
placing a first package substrate on a carrier substrate;
forming a frame on the first package substrate;
affixing an active side of a first semiconductor die on the package substrate, the first semiconductor die located over the frame forming a cavity between the first semiconductor die and the first package substrate; and
encapsulating with an encapsulant at least a portion of the first semiconductor die and the first package substrate, the frame preventing the encapsulant from entering the cavity.

11. The method of claim 10, wherein the active side of the first semiconductor die is interconnected to a conductive trace of the first package substrate by way of a conductive die connector.

12. The method of claim 10, wherein the frame is configured to substantially surround a portion of the active side of the first semiconductor die, the portion of the active side including circuitry characterized as stress sensitive circuitry.

13. The method of claim 10, wherein the package substrate includes an opening through the first package substrate, the opening configured to allow pressure equalization between the cavity and atmosphere immediately surrounding the semiconductor device.

14. The method of claim 10, further comprising applying a second package substrate over a major side of the encapsulant opposite of the first package substrate, the second package substrate interconnected with the first package substrate by way of a through package via (TPV).

* * * * *